(12) United States Patent
Chen et al.

(10) Patent No.: US 11,875,756 B2
(45) Date of Patent: Jan. 16, 2024

(54) BACKLIGHT BOARD AND DRIVING METHOD THEREOF, BACKLIGHT MODULE AND DRIVING METHOD THEREOF, AND DISPLAY DEVICE

(71) Applicant: FOSHAN NATIONSTAR OPTOELECTRONICS CO., LTD., Foshan (CN)

(72) Inventors: Weineng Chen, Foshan (CN); Xiang Chen, Foshan (CN); Dequan Zheng, Foshan (GD); Zhonghai Yan, Foshan (CN); Fabo Liu, Foshan (CN); Danlei Gong, Foshan (CN); Hua Fan, Foshan (CN)

(73) Assignee: Foshan Nationstar Optoelectronics Co., Ltd., Foshan (CN)

( * ) Notice: Subject to any disclaimer, the term of this patent is extended or adjusted under 35 U.S.C. 154(b) by 0 days.

(21) Appl. No.: 18/136,018

(22) Filed: Apr. 18, 2023

(65) Prior Publication Data

US 2023/0351974 A1    Nov. 2, 2023

(30) Foreign Application Priority Data

Apr. 28, 2022 (CN) .......................... 202210470774.5

(51) Int. Cl.
*G09G 3/34* (2006.01)
*H01L 25/075* (2006.01)

(52) U.S. Cl.
CPC ...... *G09G 3/342* (2013.01); *G09G 2300/0426* (2013.01); *G09G 2310/08* (2013.01); *G09G 2320/0626* (2013.01); *H01L 25/0753* (2013.01)

(58) Field of Classification Search
CPC .... G09G 3/3406; G09G 3/3648; G09G 3/342; G09G 3/36; G09G 3/3607; G09G 3/3413; G09G 2320/064; G09G 2320/0646; G09G 2320/0626; G09G 2320/062; G09G 2310/024; G09G 2310/0237
See application file for complete search history.

(56) References Cited

U.S. PATENT DOCUMENTS

2018/0018924 A1*  1/2018  Mao .................... G09G 3/3406
2021/0407441 A1* 12/2021  Gu ...................... G09G 3/3426

* cited by examiner

*Primary Examiner* — Dong Hui Liang
(74) *Attorney, Agent, or Firm* — Culhane Meadows PLLC; Stephen J. Weed

(57) ABSTRACT

Provided are a backlight board and a driving method thereof, a backlight module and a driving method thereof, and a display device. The backlight board includes light-emitting devices arranged in rows and columns and a first connector, where each first pin of the first connector is electrically connected to first electrodes of light-emitting devices in one row, each second pin of the first connector is electrically connected to second electrodes of light-emitting devices in one column; and in one drive cycle, a first drive signal drives light-emitting devices in each row for a duration T/n at different times, and a second drive signal drives light-emitting devices in each column for a duration T/n at different times.

18 Claims, 11 Drawing Sheets

BACKLIGHT BOARD AND DRIVING METHOD THEREOF, BACKLIGHT MODULE AND DRIVING METHOD THEREOF, AND DISPLAY DEVICE

CROSS-REFERENCE TO RELATED APPLICATION(S)

This application claims priority to Chinese Patent Application No. 202210470774.5 filed Apr. 28, 2022, the disclosure of which is incorporated herein by reference in its entirety.

TECHNICAL FIELD

Embodiments of the present disclosure relate to the field of display technologies and, in particular, to a backlight board and a driving method thereof, a backlight module and a driving method thereof, and a display device.

BACKGROUND

With the emergence of mini light-emitting diode (mini LED) backlight module market, the market for mini LED backlight products is becoming increasingly competitive. In the related art, to ensure the number of partitions of a mini LED backlight board, it is needed to increase the number of driver chips corresponding to the mini LED backlight board, not only increasing the costs of the driver chips corresponding to the mini LED backlight board but also making the circuit design on the mini LED backlight board more complex so that the number of circuit board layers of the mini LED backlight board is required to be increased to meet the circuit design requirements.

SUMMARY

The present disclosure provides a backlight board and a driving method thereof, a backlight module and a driving method thereof, and a display device to simplify the design of the backlight board and reduce the manufacturing cost of the backlight module on the basis of ensuring the number of backlight partitions to be unchanged.

In a first aspect, embodiments of the present disclosure provide a backlight board including light-emitting devices arranged in rows and columns and a first connector.

The first connector includes n first pins and m second pins, each of the n first pins is electrically connected to first electrodes of light-emitting devices in a respective one row of the rows and is configured to provide a first drive signal for the light-emitting devices in the respective one row, and each of the m second pins is electrically connected to second electrodes of light-emitting devices in a respective one column of the columns and is configured to provide a second drive signal for the light-emitting devices in the respective one column; and in one drive cycle, the first drive signal drives light-emitting devices in each of the rows for a duration T/n at different times, and the second drive signal drives light-emitting devices in each of the columns for a duration T/n at different times, where T denotes the time of one drive cycle, n denotes the number of the rows of the light-emitting devices, and m denotes the number of the columns of the light-emitting devices.

Optionally, in one drive cycle, the second drive signal includes $2^n$ types of timing arrangement modes.

Optionally, the backlight board further includes a substrate, first connection lines disposed on the substrate and second connection lines disposed on the substrate. The light-emitting devices are disposed on one surface of the substrate and the first connector is disposed on another surface of the substrate, each of the n first pins is electrically connected to the first electrodes of the light-emitting devices in the respective one row through a respective one first connection line of the first connection lines, and each of the m second pins is electrically connected to the second electrodes of the light-emitting devices in the respective one column through a respective one second connection line of the second connection lines.

Optionally, the backlight board further includes a support structure, where the support structure and the light-emitting devices are located on the same surface of the substrate.

In a second aspect, embodiments of the present disclosure further provide a backlight module including a drive unit, a second connector and the backlight board provided in the first aspect.

The second connector includes n third pins and m fourth pins, each of the n third pins is electrically connected to a respective one first pin of the n first pins, each of the m fourth pins is electrically connected to a respective one second pin of the m second pins, and the drive unit is connected to the second connector and is configured to provide drive signals to the light-emitting devices through the second connector and the first connector.

Optionally, the first connector is a receptacle of a connector and the second connector is a plug of the connector paired with the receptacle of the connector.

Optionally, the backlight module further includes a driver board on which the drive unit and the second connector are disposed, where the second connector is plugged into the first connector.

In a third aspect, embodiments of the present disclosure further provide a display device including the backlight module provided in the second aspect.

In a fourth aspect, embodiments of the present disclosure further provide a driving method of a backlight board, and the method is applied to driving the backlight board provided in the first aspect. The method includes the steps below.

First drive signals are provided for first pins while second drive signals are provided for second pins.

The first pins transmit the first drive signals to first electrodes of light-emitting devices, and the second pins transmit the second drive signals to second electrodes of the light-emitting devices.

In a fifth aspect, embodiments of the present disclosure also provide a driving method of a backlight module and the method is applied to driving the backlight module provided in the second aspect. The method includes the steps below.

A drive unit provides first drive signals for third pins while providing second drive signals for fourth pins.

The third pins transmit the first drive signals to first electrodes of light-emitting devices through first pins, and the fourth pins transmit the second drive signals to second electrodes of the light-emitting devices through second pins.

In the schemes of this embodiment, the first drive signal corresponding to a different row drives the light-emitting devices in a corresponding row for one sub-cycle in a time-sharing mode, and meanwhile, the second drive signal corresponding to a different column drives the light-emitting devices in a corresponding column for one sub-cycle in a time-sharing mode so that the first drive signal and the second drive signal can control each light-emitting device to be on or off in one drive cycle, ensuring the maximum number of backlight partitions. Moreover, it is feasible to drive each light-emitting device by only one first connector so that the need for connectors and the manufacturing cost of the backlight board can be reduced on the basis of the separate design of the backlight board and the driver board in the backlight module. When the backlight board is used for forming the backlight module, it is feasible to drive the backlight board with only one driver chip so that the number of required driver chips and the manufacturing cost of the backlight module can be reduced, and the design of the backlight board can be simplified.

DETAILED DESCRIPTION

Figure 1:
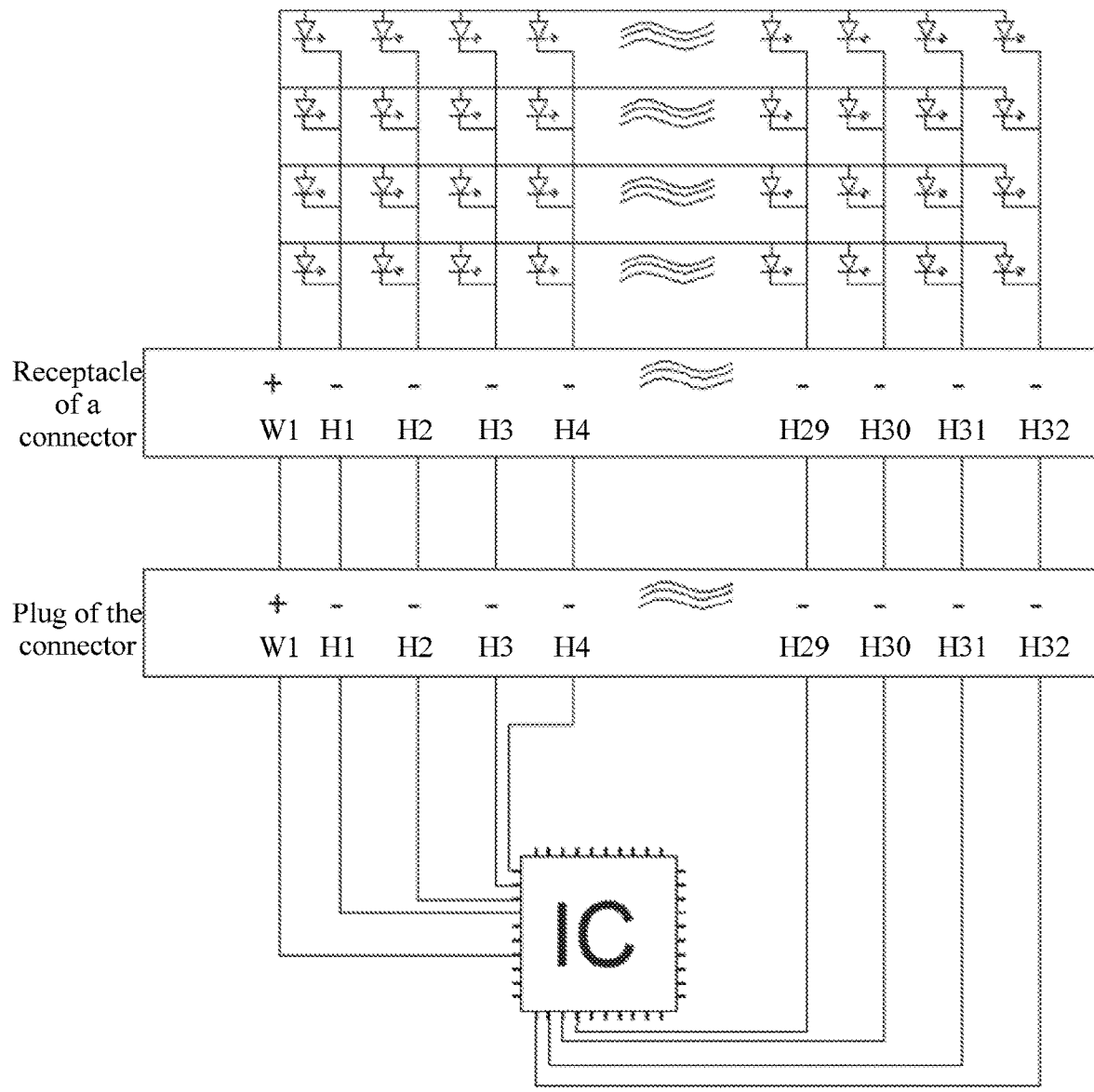
FIG. 1 is a structure diagram of a backlight module according to the related art.

Hereinafter the present disclosure is further described in detail in conjunction with the drawings and embodiments. It is to be understood that the embodiments described herein are only intended to illustrate but not to limit the present disclosure. Additionally, it is to be noted that, for ease of description, only part, not all, of structures related to the present disclosure are illustrated in the drawings.

FIG. 1 is a structure diagram of a backlight module according to the related art. As shown in FIG. 1, the backlight module includes a receptacle of a connector, a plug of the connector, a driver chip IC and LEDs arranged in an array. The case where the backlight module includes LEDs arranged in four rows and thirty-two columns is used as an example. Anodes of the LEDs are connected to one signal output pin of the driver chip IC through a W1 pin of the receptacle of the connector and a W1 pin of the plug of the connector. Cathodes of LEDs in each column are connected to one signal output pin of the driver chip IC through one pin of the receptacle of the connector and one pin of the plug of the connector corresponding to the one pin of the receptacle of the connector. For example, cathodes of LEDs in the first row are connected to one signal output pin of the driver chip IC through an H1 pin of the receptacle of the connector and an H1 pin of the plug of the connector, and cathodes of LEDs in the second row are connected to one signal output pin of the driver chip IC through an H2 pin of the receptacle of the connector and an H2 pin of the plug of the connector, and so on until cathodes of LEDs in the thirty-second row are connected to one signal output pin of the driver chip IC through an H32 pin of the receptacle of the connector and an H32 pin of the plug of the connector. When the driver chip IC drives the LEDs to emit light, the driver chip IC can simultaneously control LEDs in one column to be on or off, making the number of partitions of the LED backlight module to be relatively small, and affecting the use effect of the LED backlight module.

Figure 2:
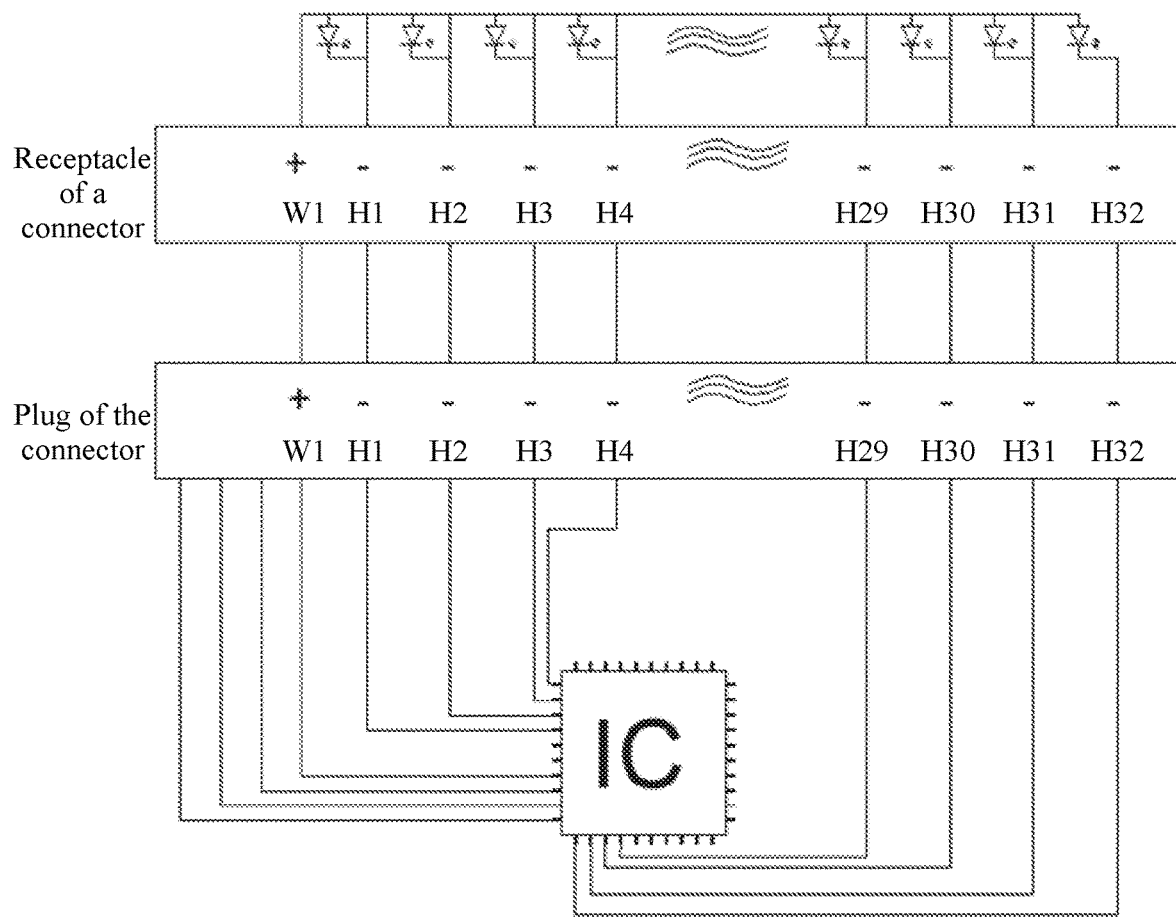
FIG. 2 is a schematic diagram of a connection structure of one row of LEDs of a backlight module according to the related art.

To ensure the number of partitions of the LED backlight module, three driver chip ICs, three receptacles of connectors and three plugs of the connectors may be added, and each driver chip IC may be connected to LEDs in one row through one receptacle of a connector and one plug of the connector. FIG. 2 is a schematic diagram of a connection structure of one row of LEDs of a backlight module according to the related art. As shown in FIG. 2, each driver chip IC may control LEDs in one row and thirty-two columns to individually emit light, and four driver chip ICs may control each LED to be on or off so that the number of partitions of the LED backlight module is maximized, thereby ensuring the use effect of the LED backlight module. However, the number of driver chip ICs required by the LED backlight module is relatively large so that the number of receptacles of connectors and the number of plugs of the connectors required by the LED backlight module are increased, not only increasing the costs of the LED backlight module but also making the circuit design on the LED backlight module more complex and requiring to increase the number of circuit board layers of the LED backlight module to meet the circuit design requirements.

Figure 3:
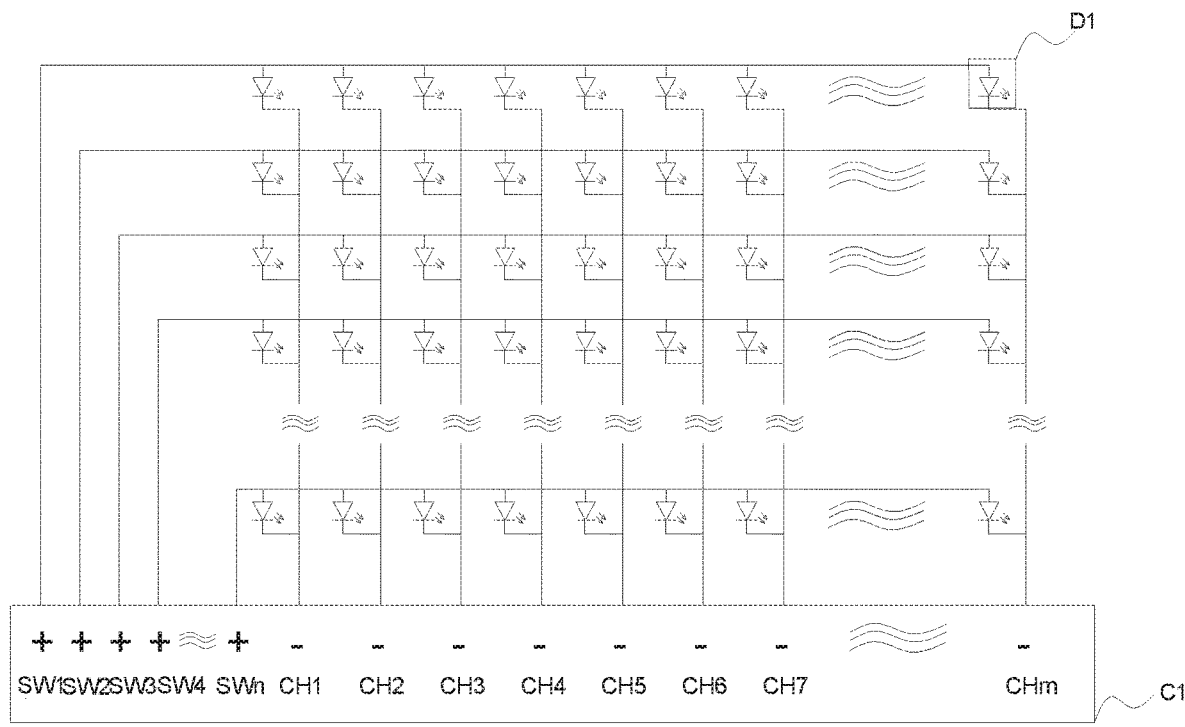
FIG. 3 is a structure diagram of a backlight board according to an embodiment of the present disclosure.

In view of the above technical issues, embodiments of the present disclosure provide a backlight board. FIG. 3 is a structure diagram of a backlight board according to an embodiment of the present disclosure. As shown in FIG. 3, the backlight board includes light-emitting devices D1 arranged in an array and a first connector C1, where the first connector C1 includes n first pins SWn and m second pins CHm, each of the n first pins SWn is electrically connected to first electrodes of light-emitting devices D1 in one row and is configured to provide a first drive signal for the light-emitting devices D1 in the one row, and each of them second pins CHm is electrically connected to second electrodes of light-emitting devices D1 in one column and is configured to provide a second drive signal for the light-emitting devices D1 in the one column; and in one drive cycle, the first drive signal drives light-emitting devices in each row for a duration T/n at different times, and the second drive signal drives light-emitting devices in each column for a duration T/n at different times, where T denotes time of one drive cycle, n denotes the number of rows of the light-emitting devices, and m denotes the number of columns of the light-emitting devices.

In an embodiment, the light-emitting devices D1 may be mini LEDs. The first connector C1 may be a receptacle of a connector. The backlight board is used within a backlight module. The backlight board may provide a light source for the backlight module. When each first pin SWn is electrically connected to the first electrodes of light-emitting devices D1 in one row, one first pin SWn may provide the first drive signal for the first electrodes of the light-emitting devices D1 in one row. For example, the first electrodes of the light-emitting devices D1 are anodes. When each second pin CHm is electrically connected to the second electrodes of light-emitting devices D1 in one column, one second pin CHm may provide the second drive signal for the second electrodes of the light-emitting devices D1 in one column. Here, the second drive signal drives any number of light-emitting devices D1 among the light-emitting devices D1 in one column for a duration T/n at different times, and the any number may be an integer greater than or equal to 0 and less than or equal to n. For example, the second electrodes of the light-emitting devices D1 are cathodes. In addition, one drive cycle may be divided into multiple sub-cycles, and the time of each sub-cycle is T/n. During the operating process of the backlight board, different first pins SWn may provide first drive signals for different rows of light-emitting devices D1 in different sub-cycles so that in the same sub-cycle, the first electrodes of light-emitting devices D1 in only one row have the first drive signal. Moreover, in different sub-cycles, each second drive signal may drive light-emitting devices D1 in one column to be on or off so that in one sub-cycle, one light-emitting device D1 can be determined to be on or off according to the row corresponding to the first drive signal and the column corresponding to the second drive signal, and then in another sub-cycle, one light-emitting device D1 can also be determined to be on or off according to the row corresponding to the first drive signal and the column corresponding to the second drive signal so that in one drive cycle, each light-emitting device D1 can be individually controlled to be on or off, ensuring the maximum number of backlight partitions. Moreover, each light-emitting device D1 can be driven by only one first connector C1 so that the need for connectors and the manufacturing cost of the backlight board can be reduced on the basis of the separate design of the backlight board and the driver board in the backlight module. When the backlight board is used for forming the backlight module, it is feasible to drive the backlight board with only one driver chip so that the number of required driver chips and the manufacturing cost of the backlight module can be reduced, and the design of the backlight board can be simplified.

Figure 4:
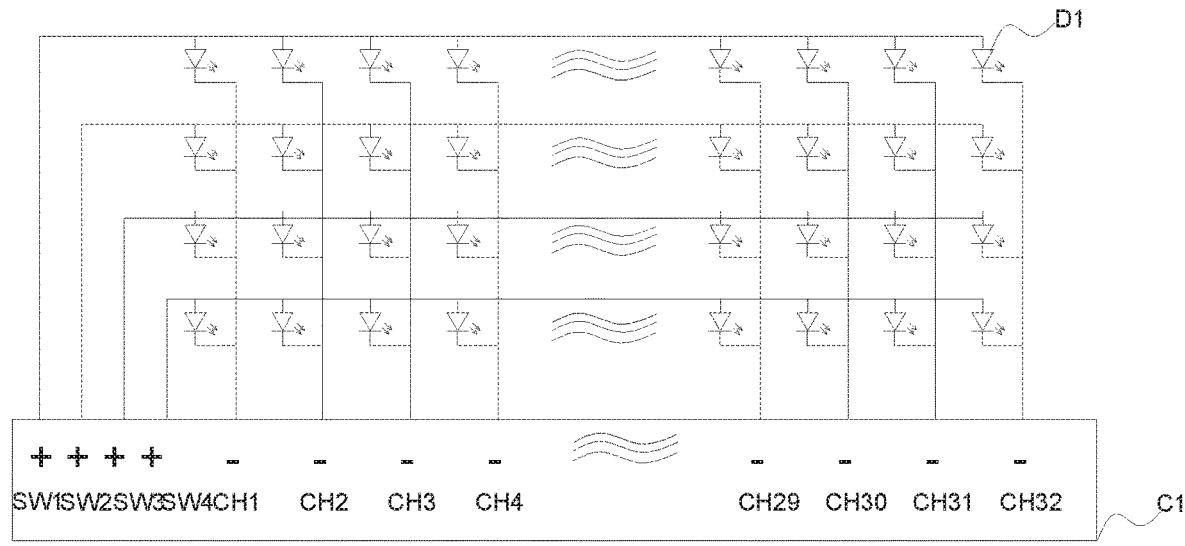
FIG. 4 is a structure diagram of another backlight board according to an embodiment of the present disclosure.
Figure 5:
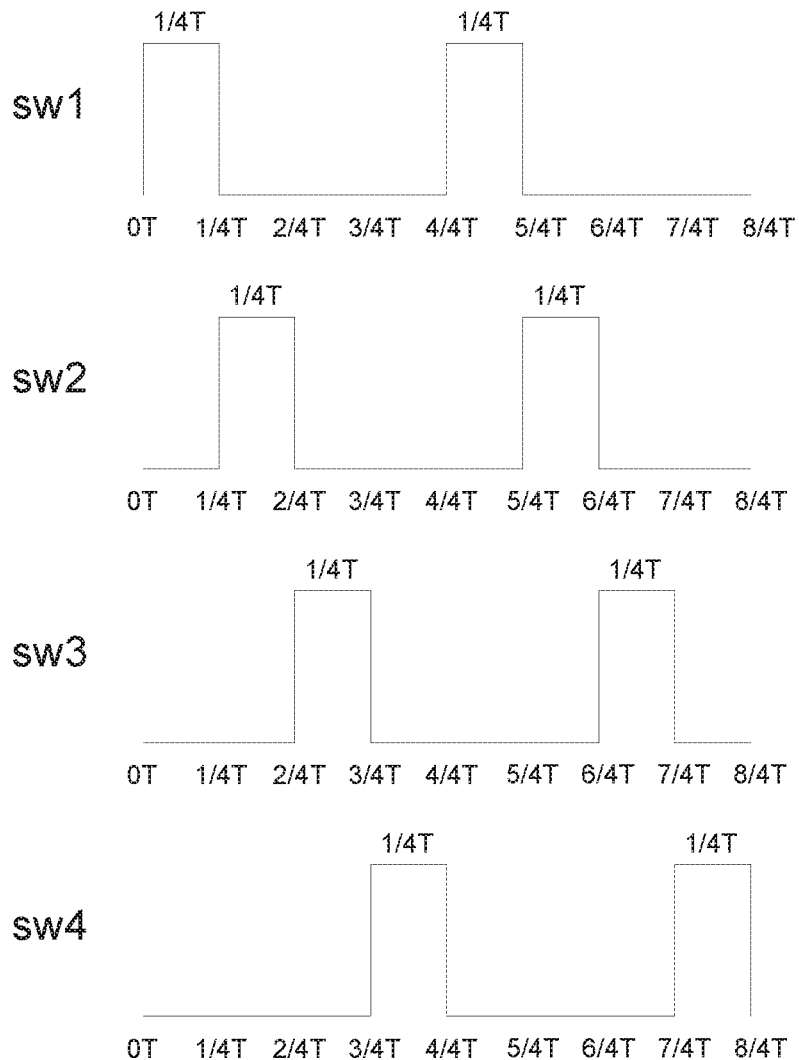
FIG. 5 is a timing diagram of a first drive signal according to an embodiment of the present disclosure.
Figure 6:
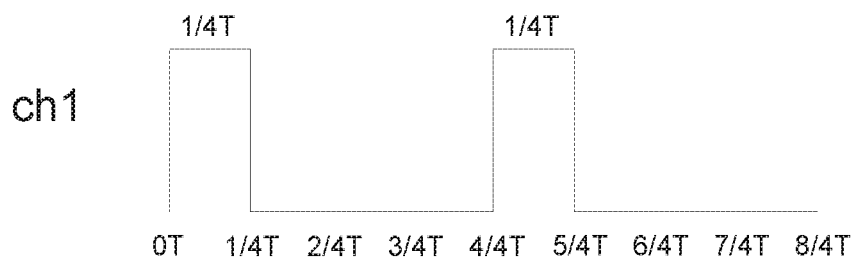
FIG. 6 is a timing diagram of a second drive signal according to an embodiment of the present disclosure.

For example, FIG. 4 is a structure diagram of another backlight board according to an embodiment of the present disclosure. As shown in FIG. 4, the backlight board includes light-emitting devices D1 in four rows and thirty-two columns, the corresponding first connector C1 includes four first pins, namely SW1, SW2, SW3 and SW4, respectively. Moreover, the first connector C1 includes thirty-two second pins, namely CH1, CH2, . . . , and CH32, respectively. FIG. 5 is a timing diagram of a first drive signal according to an embodiment of the present disclosure. Here, sw1 is a timing diagram corresponding to a first drive signal provided by the first pin SW1, sw2 is a timing diagram corresponding to a first drive signal provided by the first pin SW2, sw3 is a timing diagram corresponding to a first drive signal provided by the first pin SW3, and sw4 is a timing diagram corresponding to a first drive signal provided by the first pin SW4. As shown in FIG. 5, one drive cycle T is divided into four sub-cycles in total, and only one first pin in each sub-cycle provides the first drive signal. For example, when the active level of the first drive signal is high, the first pins SW1, SW2, SW3 and SW4 sequentially provide the first drive signals in each sub-cycle. Then, the first row of light-emitting devices D1 to the fourth row of light-emitting devices D1 of the backlight board sequentially acquire the first drive signals in each sub-cycle. FIG. 6 is a timing diagram of a second drive signal according to an embodiment of the present disclosure. Here, ch1 is a timing diagram corresponding to a second drive signal provided by the second pin CH1. As shown in FIG. 6, when the active level of the second drive signal is high, and the second pin CH1 provides the second drive signal in the first sub-cycle, the first drive signal and the second drive signal may drive the light-emitting devices D1 in the first row and the first column to be on; and in the second sub-cycle to the fourth sub-cycle, the first drive signal and the second drive signal drive the light-emitting devices D1 in the second row and the first column, the light-emitting devices D1 in the third row and the first column, and the light-emitting devices D1 in the fourth row and the first column to be off, thereby achieving the individual driving of each light-emitting device D1. Similarly, the second drive signal corresponding to another column of light-emitting devices D1 may be set according to the driving requirements.

It is to be noted that only one timing of the second drive signal is shown as an example in FIG. 6. In other embodiments, in one drive cycle, the second drive signal may have multiple timings, and the timing of the second drive signal can be set according to the driving requirements. For example, the second drive signal may be provided both in the first sub-cycle and the second sub-cycle. In this case, in the first sub-cycle, the first drive signal and the second drive signal may drive the light-emitting devices D1 in the first row and the first column to be on; in the second sub-cycle, the first drive signal and the second drive signal may drive the light-emitting devices D1 in the second row and the first column to be on; and in the third sub-cycle and the fourth sub-cycle, the first drive signal and the second drive signal may drive the light-emitting devices D1 in the third row and the first column and the light-emitting devices D1 in the fourth row and the first column to be off.

In addition, FIG. 6 only exemplarily shows a timing diagram of the second drive signal provided by the second pin CH1. The timing of each of second drive signals provided by the second pins CH2 to CH32 and the timing of the second drive signal provided by the second pin CH1 may be the same or different, and can be set according to the driving requirements and are not limited herein.

In the schemes of this embodiment, the first drive signal corresponding to a different row drives the light-emitting devices in a corresponding row for one sub-cycle in a time-sharing mode, and the second drive signal corresponding to a different column drives the light-emitting devices in a corresponding column for one sub-cycle in a time-sharing mode so that the first drive signal and the second drive signal can control each light-emitting device to be on or off in one drive cycle, ensuring the maximum number of backlight partitions. Moreover, it is feasible to drive each light-emitting device by only one first connector so that the need for connectors and the manufacturing cost of the backlight board can be reduced on the basis of the separate design of the backlight board and the driver board in the backlight module. When the backlight board is used for forming the backlight module, it is feasible to drive the backlight board with only one driver chip so that the number of required driver chips and the manufacturing cost of the backlight module can be reduced, and the design of the backlight board can be simplified.

On the basis of the above schemes, in one drive cycle, the second drive signal includes $2^n$ types of timing arrangement modes.

In an embodiment, the second drive signal may be independently set in each sub-drive cycle according to the driving requirements so that the state of light-emitting devices in each column may be individually controlled in different sub-cycles. When the backlight board includes n rows of light-emitting devices, and n light-emitting devices are included in each column, each drive cycle may be divided into n sub-cycles, and in each sub-cycle, the second drive signal may drive the light-emitting devices in one column to be on or off, so the second drive signal has two states in each sub-cycle. In one drive cycle, the second drive signal is determined to have $2^n$ types by way of combinations. For example, Table 1 is a table illustrating that the timing of the second drive signal corresponds to the state of light-emitting devices in one column according to an embodiment of the present disclosure. Referring to FIG. 4 and Table 1, when the backlight board includes light-emitting devices D1 in four rows and thirty-two columns, one drive cycle is divided into four sub-cycles, and in one drive cycle, the second drive signal corresponding to each column may has $2^4$ arrangement modes. In Table 1, the first column corresponds to the timing of the second drive signal CH1 in one drive cycle, and the second column corresponds to the states of four light-emitting devices D1 in a column corresponding to the second drive signal. It can be seen from Table 1 that by controlling the state of the second drive signal in each sub-cycle, it is feasible to control each light-emitting device to be on or off in one drive cycle, thereby ensuring the maximum number of backlight partitions. Moreover, it is feasible to drive each light-emitting device by only one first connector so that the need for connectors and the manufacturing cost of the backlight board can be reduced on the basis of the separate design of the backlight board and the driver board in the backlight module. When the backlight board is used for forming the backlight module, it is feasible to drive the backlight board with only one driver chip so that the number of required driver chips and the manufacturing cost of the backlight module can be reduced, and the design of the backlight board can be simplified.

TABLE 1 illustrating correspondence between timings of the second drive signal and states of light-emitting devices in one column

| Timings of CH1 | States of light-emitting devices D1 |
|---|---|
| (flat low across 0T–8/4T) | off off off off |
| pulse at 1/4T and 1/4T (around 4/4T) | on off off off |
| pulse at 1/4T (around 2/4T) and 1/4T (around 5/4T) | off on off off |
| pulse at 1/4T (around 3/4T) and 1/4T (around 6/4T) | off off on off |
| pulse at 1/4T (around 3/4T) and 1/4T (around 7/4T) | off off off on |
| long high from 0T to ~4/4T then low, then high again | on on off off |
| alternating pulses | on off on off |
| pulse pattern | on off off on |
| pulse pattern | off on on off |
| pulse pattern | off on off on |
| pulse pattern | off off on on |
| pattern | on on on off |
| pattern | on on off on |
| pattern | on off on on |
| pattern | off on on on |
| high throughout | on on on on |

Figure 7:
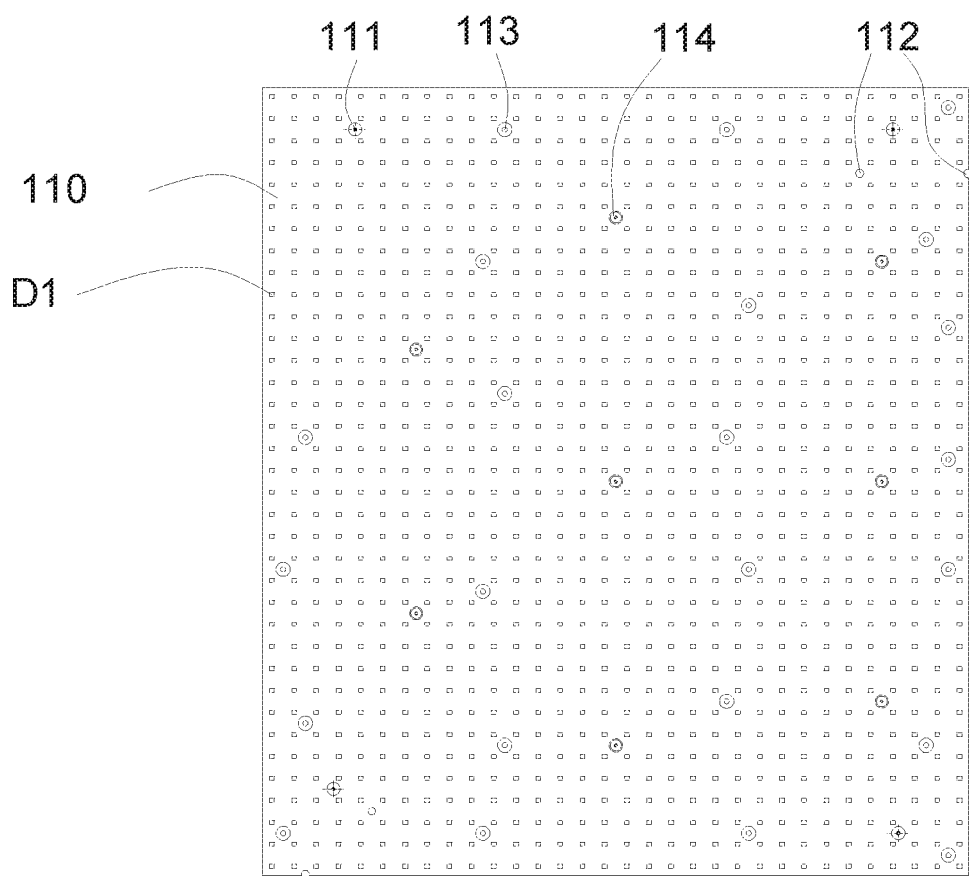
FIG. 7 is a front top view of a backlight board according to an embodiment of the present disclosure.
Figure 8:
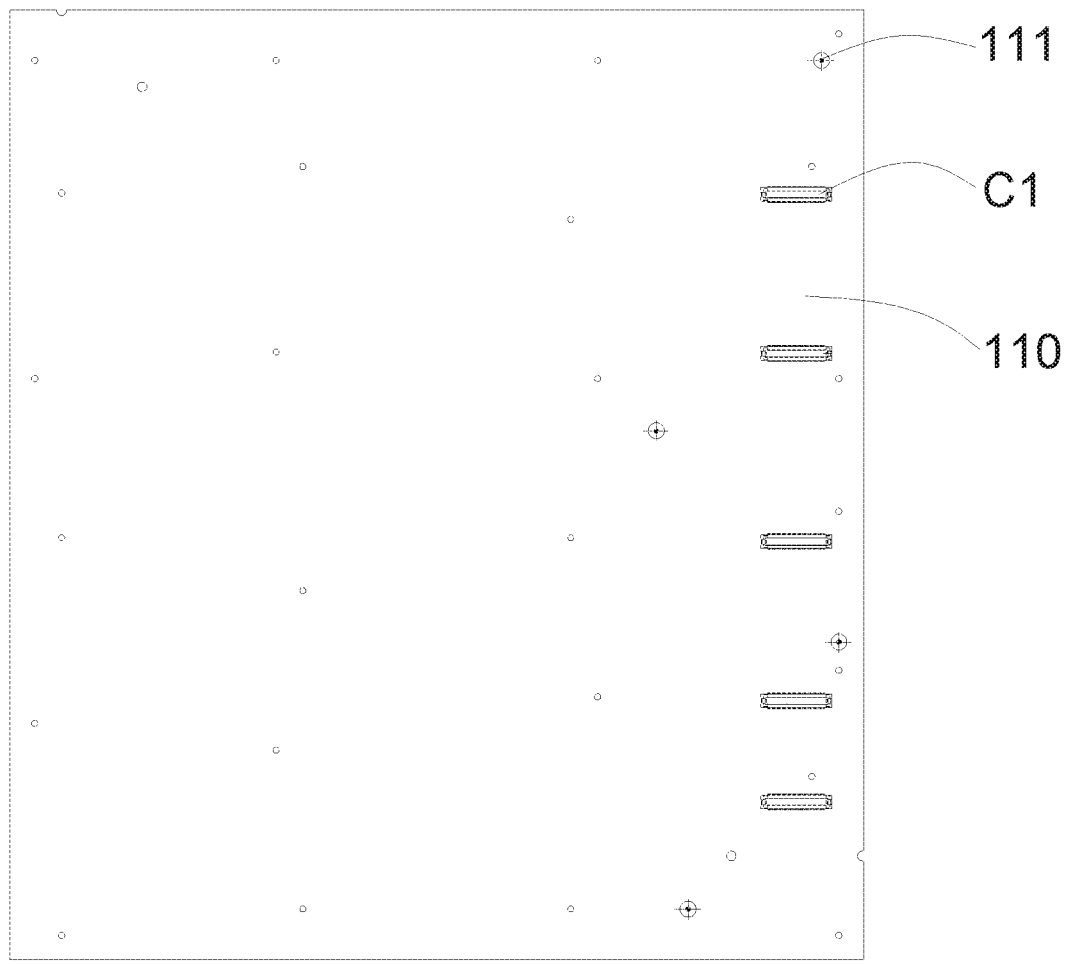
FIG. 8 is a rear top view of a backlight board according to an embodiment of the present disclosure.

FIG. 7 is a front top view of a backlight board according to an embodiment of the present disclosure. FIG. 8 is a rear top view of a backlight board according to an embodiment of the present disclosure. As shown in FIGS. 7 and 8, the backlight board further includes a substrate 110, first connection lines disposed on the substrate 110 and second connection lines disposed on the substrate 110. The light-emitting devices D1 are disposed on one surface of the substrate 110 and the first connector C1 is disposed on the other surface of the substrate 110, the first electrodes of the light-emitting devices D1 in one row are electrically connected to a first pin through a first connection line, and the second electrodes of the light-emitting devices D1 in one column are electrically connected to a second pin through a second connection line.

In an embodiment, the substrate 110 is configured to carry the light-emitting devices D1 and the first connector C1. For example, the substrate 110 may be a printed circuit board. The light-emitting devices D1 may be uniformly disposed on the front surface of the substrate 110, the first connector C1 may be disposed on the back surface of the substrate 110, and the first connection lines and the second connection lines (not shown in FIGS. 7 and 8) may be disposed in a board layer of the substrate 110. The first electrodes of the light-emitting devices D1 in one row may be electrically connected through the first connection line, and then electrically connected one first pin through a connection line, and the second electrodes of the light-emitting devices D1 in one column may be electrically connected through the second connection line, and then electrically connected through one second pin through a connection line so that one first drive signal can drive the light-emitting devices D1 in one row, and one second drive signal can drive the light-emitting devices D1 in one column.

Referring to FIGS. 7 and 8, the front and back surfaces of the substrate 110 are provided with multiple optical points 111 for positioning components when the components are patched by the surface mount technology (SMT). The substrate 110 is further provided with multiple positioning holes 112 so that when the backlight board forms the backlight module, the positioning between the backlight board and the backlight module can be achieved. Moreover, the substrate 110 is provided with fixing holes 113. For example, the fixing holes 113 may be screw holes. The fixing holes 113 can fix the backlight board and the backlight module.

Referring to FIG. 7, the backlight board further includes support structures 114, where the support structures 114 and the light-emitting devices D1 are located on the same surface of the substrate 110.

In an embodiment, each of the support structures 114 has a certain height. When the backlight board forms the backlight module for use in the display device, the support structures 114 can make the front surface of the backlight board have a certain space with other structures in the display device so that a merging distance is provided between the light-emitting devices D1 on the front surface of the backlight board and other structures in the display device, thereby ensuring the reliability of providing the light source for the display device by the backlight board. For example, the display module includes a diffuser plate and an optical film layer. The support structures 114 may support the diffuser plate and the optical film layer so that a merging distance is provided between the light-emitting devices D1 on the front surface of the backlight board and the diffuser plate and the optical film layer, thereby ensuring the reliability of providing the light source for the display device by the backlight board.

Figure 9:
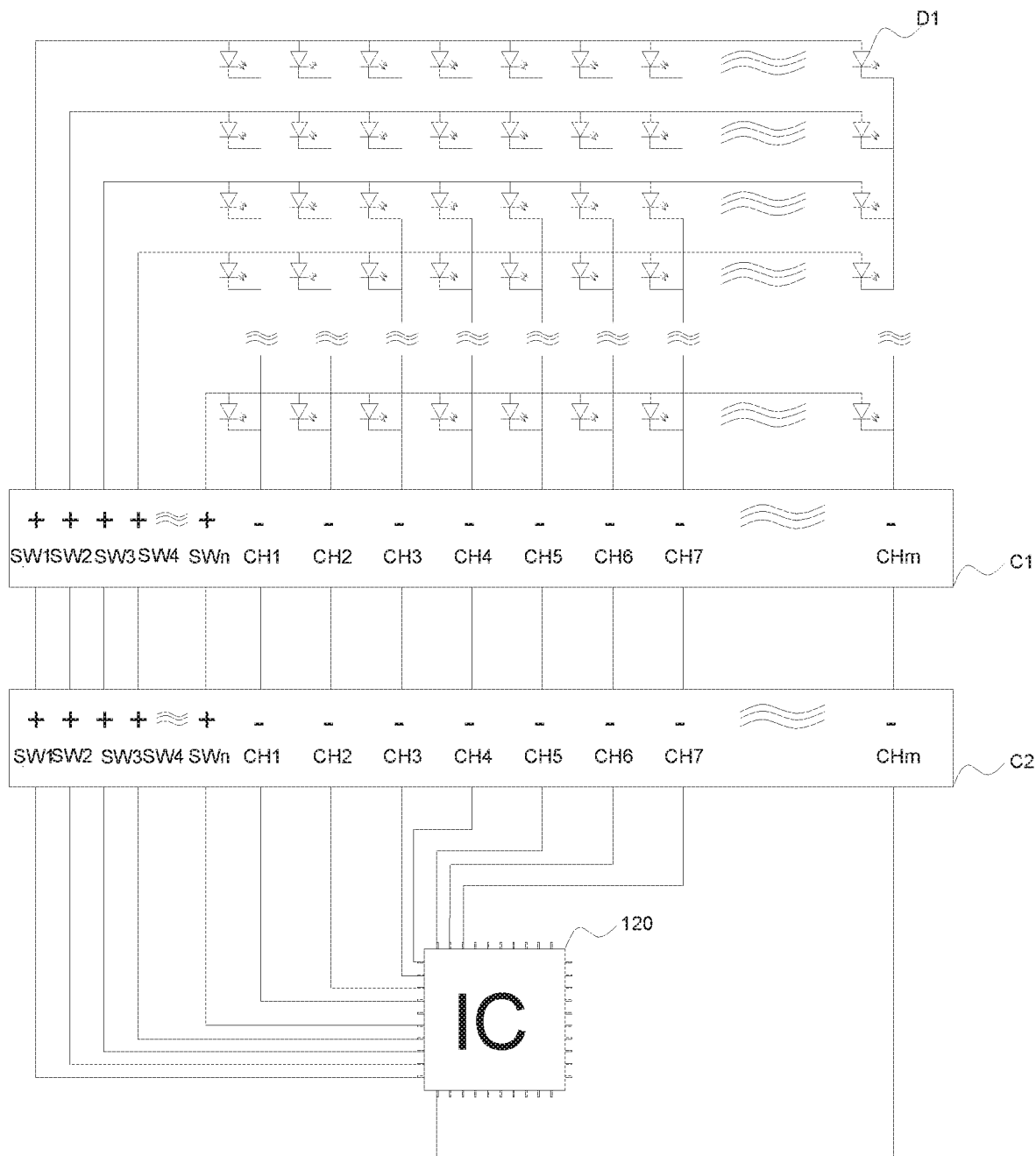
FIG. 9 is a structure diagram of a backlight module according to an embodiment of the present disclosure.

Embodiments of the present disclosure further provide a backlight module. FIG. 9 is a structure diagram of a backlight module according to an embodiment of the present disclosure. As shown in FIG. 9, the backlight module includes a drive unit 120, a second connector C2, and the backlight board provided by any embodiment of the present disclosure. The second connector C2 includes n third pins SWn and m fourth pins CHm, where each of the third pins SWn is electrically connected to a respective one of the first pins SWn, each of the fourth pins CHm is electrically connected to a respective one of the second pins CHm, and the drive unit 120 is connected to the second connector C2 and is configured to provide drive signals for the light-emitting devices D1 through the second connector C2 and the first connector C1.

In an embodiment, the second connector C2 and the first connector C1 are disposed correspondingly. Each of the third pins SWn is connected to a respective one of the first pins SWn correspondingly, each of the fourth pins CHm is connected to a respective one of the second pins CHm correspondingly, and multiple pins of the drive unit 120 are connected to the third pins SWn and the fourth pins CHm, respectively, so that the drive unit 120 provides a first drive signal for light-emitting devices in one row through the third pin SWn and the first pin SWn, and provides a second drive signal for light-emitting devices D1 in one column through the fourth pin CHm and the second pin CHm. For example, the drive unit 120 may be a driver chip. In one drive cycle, the driver chip may provide each of first drive signals in a time-sharing mode, and provide second drive signals having different timings according to the driving requirements. In one drive cycle, the first drive signal drives light-emitting devices in each row for a duration T/n at different times so that in the same sub-cycle, first electrodes of light-emitting devices D1 in only one row have the first drive signal. Moreover, the second drive signal drives any number of light-emitting devices D1 among the light-emitting devices in one column for a duration T/n at different times so that in different sub-cycles, each second drive signal can drive the light-emitting devices D1 in one column to be on or off. Therefore, in one drive cycle, each light-emitting device D1 can be individually controlled to be on or off, ensuring the maximum number of backlight partitions. Moreover, each light-emitting device D1 can be driven by only one first connector C1 and one second connector C2 so that the need for connectors and the manufacturing cost of the backlight module can be reduced on the basis of the separate design of the backlight board and the drive unit 120. Moreover, the backlight board can be driven by only one drive unit 120 so that the number of drive units 120 required by the backlight module is reduced, thereby reducing the manufacturing cost of the backlight module, and simplifying the design of the backlight board.

Figure 10:
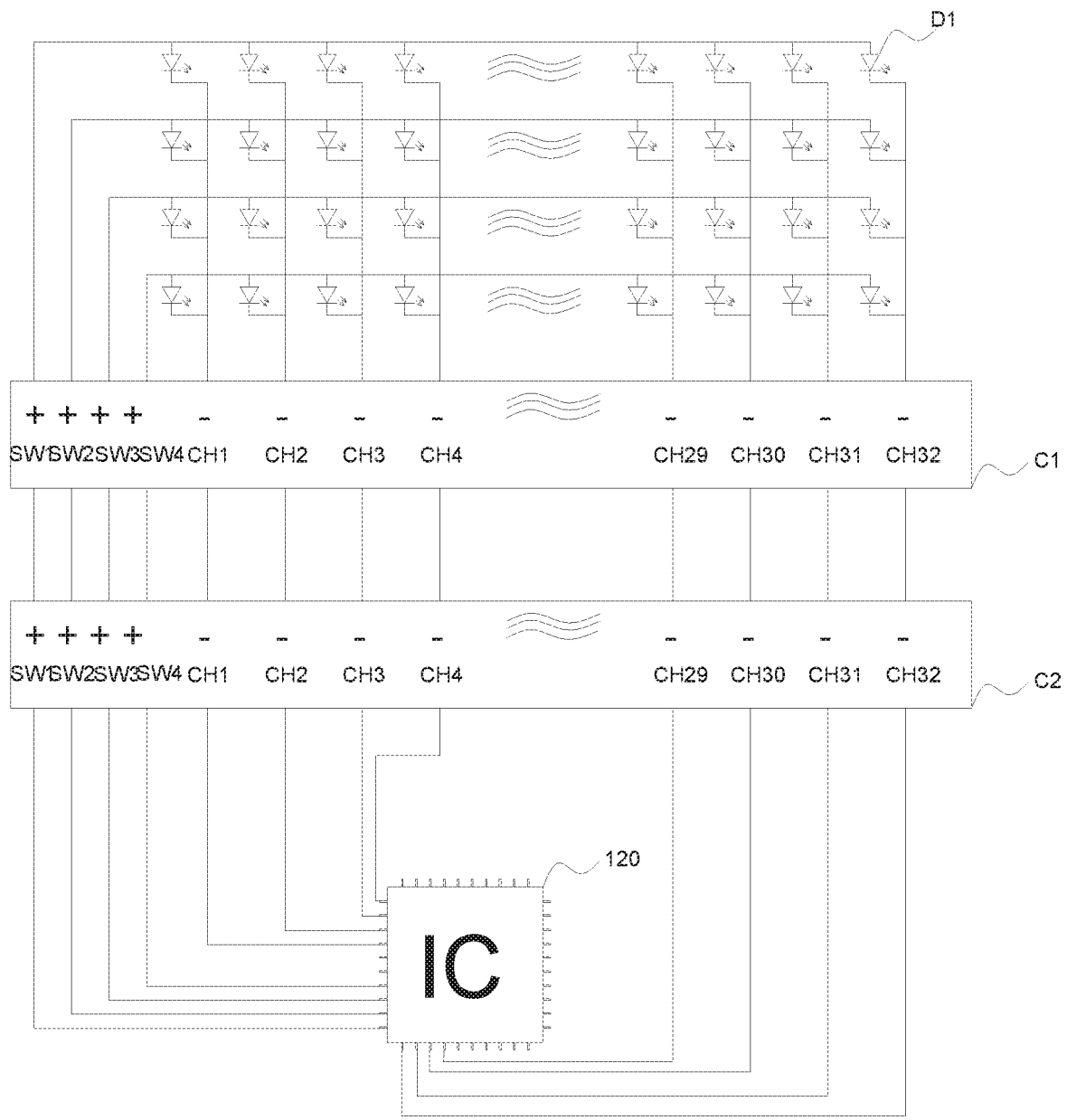
FIG. 10 is a structure diagram of another backlight module according to an embodiment of the present disclosure.

For example, FIG. 10 is a structure diagram of another backlight module according to an embodiment of the present disclosure. As shown in FIG. 10, the backlight board includes light-emitting devices D1 in four rows and thirty-two columns, the corresponding first connector C1 includes four first pins, namely SW1, SW2, SW3 and SW4, respectively, and the second connector C2 also includes four third pins, namely SW1, SW2, SW3 and SW4, respectively. The first connector C1 includes thirty-two second pins, namely CH1, CH2, . . . , and CH32, respectively, and the second connector C2 also includes thirty-two fourth pins, namely CH1, CH2, . . . , and CH32, respectively. Each of the first pins is connected to a respective one of the third pins correspondingly, and each of the second pins is connected to a respective one of the fourth pins correspondingly. One drive cycle is divided into four sub-cycles in total, and the drive unit 120 provides the first drive signal through the third pin and the first pin in each sub-cycle so that light-emitting devices D1 in the first row to light-emitting devices D1 in the fourth row of the backlight board sequentially acquire the first drive signal in each sub-cycle. Moreover, the drive unit 120 provides the second drive signal through the fourth pin and the second pin in one sub-cycle so that the first drive signal provided in this sub-cycle drives the light-emitting devices D1 in a corresponding row to be on and the second drive signal provided in this sub-cycle drives the light-emitting devices D1 in a corresponding column to be on, thereby achieving the individual driving of each light-emitting device D1.

On the basis of the above schemes, the first connector is a receptacle of a connector, and the second connector is a plug of the connector paired with the receptacle of the connector.

In an embodiment, the first connector and the second connector may be the receptacle of the connector and the plug of the connector, respectively. The corresponding connection between pins of the first connector and pins of the second connector can be directly achieved through the receptacle of the connector and the plug of the connector can so that not only the connection process is simplified, but also the backlight board and the drive unit can be disposed separately, thereby facilitating the circuit design and the structure design of the backlight board. For example, the first connector is the receptacle of the connector and the second connector is the plug of the connector.

Figure 11:
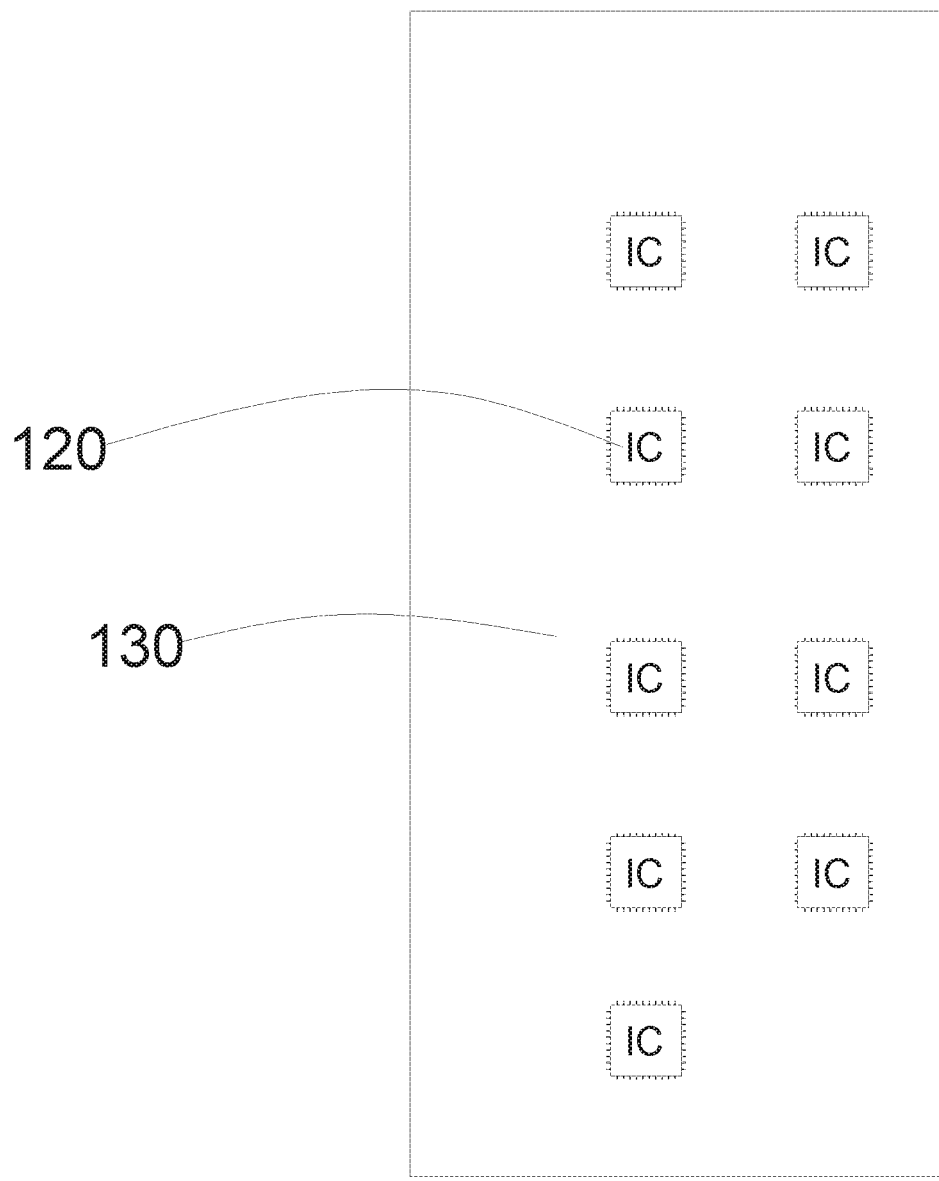
FIG. 11 is a front top view of a driver board according to an embodiment of the present disclosure.
Figure 12:
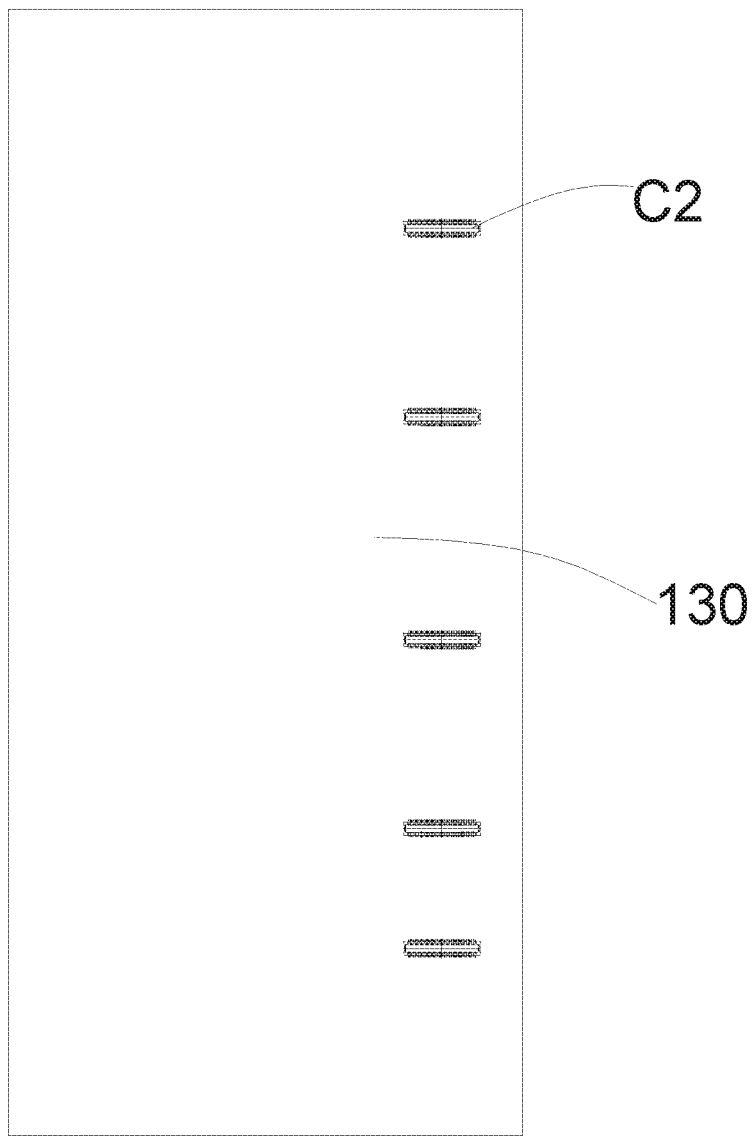
FIG. 12 is a rear top view of a driver board according to an embodiment of the present disclosure.

FIG. 11 is a front top view of a driver board according to an embodiment of the present disclosure. FIG. 12 is a rear top view of a driver board according to an embodiment of the present disclosure. As shown in FIGS. 11 and 12, the backlight module further includes a driver board 130 on which drive units 120 and the second connector C2 are disposed, where the second connector C2 is plugged into the first connector C1.

In an embodiment, the driver board 130 is configured to carry the drive units 120 and the second connector C2. For example, the driver board 130 may be a printed circuit board. The drive units 120 may be disposed on one surface of the driver board 130, and the second connector C2 may be disposed on the other surface of the driver board 130, where the one surface of the driver board 130 is opposite to the other surface of the driver board 130. For example, the drive units 120 are disposed on the front side of the driver board 130, and the second connector C2 is disposed on the rear side of the driver board 130. Moreover, connecting lines are disposed the board layer of the driver board 130 to achieve the corresponding connection between pins of the second connector C2 and pins of the drive unit 120. When the first connector C1 and the second connector C2 are the receptacle of the connector and the plug of the connector, respectively, the first connector C1 is disposed on the backlight board, and the second connector C2 is disposed on the driver board 130 so that the second connector C2 can be directly plugged into the first connector C1, thereby simplifying the connection process between the backlight board and the driver board 130.

Embodiments of the present disclosure further provide a display device. The display device includes the backlight module provided by any embodiment of the present disclosure. Since the display device includes the backlight module provided by any embodiment of the present disclosure, the display device has the same beneficial effects as the above backlight module, and the details are not repeated herein.

Figure 13:
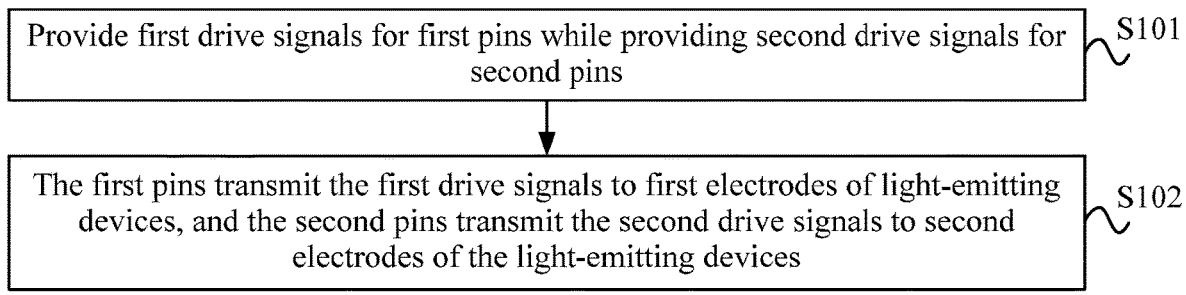
FIG. 13 is a flowchart of a driving method of a backlight board according to an embodiment of the present disclosure.

Embodiments of the present disclosure achieve provide a driving method of a backlight board and the method is applied to driving the backlight board provided by any embodiment of the present disclosure. FIG. 13 is a flowchart of a driving method of a backlight board according to an embodiment of the present disclosure. As shown in FIG. 13, the method includes the steps below.

In S101, first drive signals are provided for first pins while second drive signals are provided for second pins.

In S102, the first pins transmit the first drive signals to first electrodes of light-emitting devices, and the second pins transmit the second drive signals to second electrodes of the light-emitting devices.

In the schemes of this embodiment, the first drive signal corresponding to a different row drives the light-emitting devices in a corresponding row for one sub-cycle in a time-sharing mode, and meanwhile, the second drive signal corresponding to a different column drives the light-emitting devices in a corresponding column for one sub-cycle in a time-sharing mode so that the first drive signal and the second drive signal can control each light-emitting device to be on or off in one drive cycle, ensuring the maximum number of backlight partitions. Moreover, it is feasible to drive each light-emitting device by only one first connector so that the need for connectors and the manufacturing cost of the backlight board can be reduced on the basis of the separate design of the backlight board and the driver board in the backlight module. When the backlight board is used for forming the backlight module, it is feasible to drive the backlight board with only one driver chip so that the number of required driver chips and the manufacturing cost of the backlight module can be reduced, and the design of the backlight board can be simplified.

Figure 14:
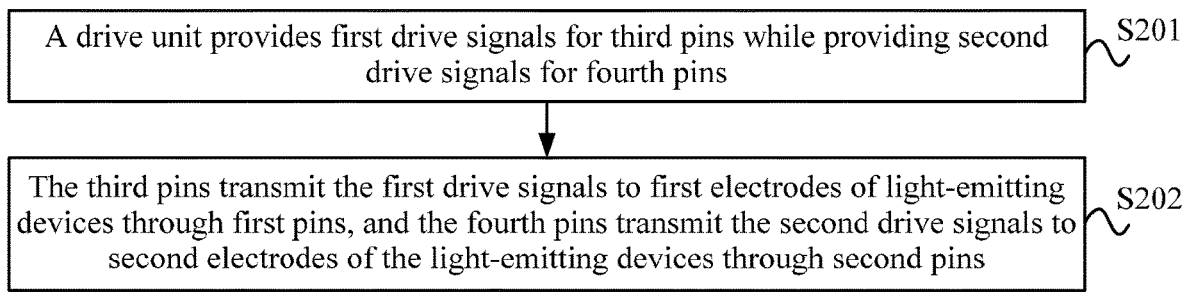
FIG. 14 is a flowchart of a driving method of a backlight module according to an embodiment of the present disclosure.

Embodiments of the present disclosure further provide a driving method of a backlight module and the method is applied to driving the backlight module provided by any embodiment of the present disclosure. FIG. 14 is a flowchart of a driving method of a backlight module according to an embodiment of the present disclosure. As shown in FIG. 14, the method includes the steps below.

In S201, a drive unit provides first drive signals for third pins while providing second drive signals for fourth pins.

In S202, the third pins transmit the first drive signals to first electrodes of light-emitting devices through first pins, and the fourth pins transmit the second drive signals to second electrodes of the light-emitting devices through second pins.

In the schemes of this embodiment, the first drive signal drives the light-emitting devices in each row for a duration T/n at different times so that in the same sub-cycle, the first electrodes of the light-emitting devices in only one row have the first drive signal. Moreover, the second drive signal drives any number of light-emitting devices D1 among the light-emitting devices in one column for a duration T/n at different times so that in different sub-cycles, each second drive signal can drive the light-emitting devices in one column to be on or off. Therefore, in one drive cycle, each light-emitting device D1 can be individually controlled to be on or off, ensuring the maximum number of backlight partitions. Moreover, it is feasible to drive each light-emitting device by only one first connector and one second connector so that the need for connectors and the manufacturing cost of the backlight module can be reduced on the basis of the separate design of the backlight board and the drive unit. Moreover, it is feasible to drive the backlight board by only one drive unit so that the number of drive units required by the backlight module is reduced so that the manufacturing cost of the backlight module can be reduced, and the design of the backlight board can be simplified.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations and substitutions can be made without departing from the scope of the present disclosure. Therefore, while the present disclosure is described in detail through the preceding embodiments, the present disclosure is not limited to the preceding embodiments and may include more equivalent embodiments without departing from the concept of the present disclosure. The scope of the present disclosure is determined by the scope of the appended claims.

What is claimed is:

1. A backlight module, comprising:
a drive unit, a second connector and a backlight board; wherein the backlight board comprises light-emitting devices arranged in rows and columns and a first connector, wherein the first connector comprises n first pins and m second pins, each of the n first pins is electrically connected to first electrodes of light-emitting devices in a respective one row of the rows and is configured to provide a first drive signal for the light-emitting devices in the respective one row, and each of the m second pins is electrically connected to second electrodes of light-emitting devices in a respective one column of the columns and is configured to provide a second drive signal for the light-emitting devices in the respective one column; and in one drive cycle, the first drive signal drives light-emitting devices in each of the rows for a duration T/n at different times, and the second drive signal drives light-emitting devices in each of the columns for a duration T/n at different times, wherein T denotes time of one drive cycle, n denotes a number of the rows of the light-emitting devices, and m denotes a number of the columns of the light-emitting devices; and
wherein the second connector comprises n third pins and m fourth pins, each of the n third pins is electrically connected to a respective one first pin of the n first pins, each of the m fourth pins is electrically connected to a respective one second pin of the m second pins, and the drive unit is connected to the second connector and is configured to provide drive signals to the light-emitting devices through the second connector and the first connector.

2. The backlight module according to claim 1, wherein the first connector is a receptacle of a connector and the second connector is a plug of the connector paired with the receptacle of the connector.

3. The backlight module according to claim 2, further comprising:
a driver board on which the drive unit and the second connector are disposed, wherein the second connector is plugged into the first connector.

4. The backlight module according to claim 1, wherein the backlight board further comprises a substrate, first connection lines disposed on the substrate and second connection lines disposed on the substrate, wherein the light-emitting devices are disposed on one surface of the substrate, and the first connector is disposed on another surface of the substrate; each of the n first pins is electrically connected to the first electrodes of the light-emitting devices in the respective one row through a respective one first connection line of the first connection lines, and each of the m second pins is electrically connected to the second electrodes of the light-emitting devices in the respective one column through a respective one second connection line of the second connection lines.

5. The backlight module according to claim 4, wherein the backlight board further comprises a support structure, wherein the support structure and the light-emitting devices are located on a same surface of the substrate.

6. The backlight module according to claim 1, wherein in one drive cycle, the second drive signal comprises $2^n$ types of timing arrangement modes.

7. A driving method of a backlight module, applied to driving the backlight module according to claim 1, and comprising:
providing, by the drive unit, first drive signals for third pins while providing second drive signals for fourth pins; and
transmitting, by the third pins, the first drive signals to first electrodes of the light-emitting devices through first pins, and transmitting, by the fourth pins, the second drive signals to second electrodes of the light-emitting devices through second pins.

8. A display device, comprising: a backlight module which comprises a drive unit, a second connector and a backlight board;
wherein the backlight board comprises light-emitting devices arranged in rows and columns and a first connector, wherein the first connector comprises n first pins and m second pins, each of the n first pins is electrically connected to first electrodes of light-emitting devices in a respective one row of the rows and is configured to provide a first drive signal for the light-emitting devices in the respective one row, and each of the m second pins is electrically connected to second electrodes of light-emitting devices in a respective one column of the columns and is configured to provide a second drive signal for the light-emitting devices in the respective one column; and in one drive cycle, the first drive signal drives light-emitting devices in each of the rows for a duration T/n at different times, and the second drive signal drives light-emitting devices in each of the columns for a duration T/n at different times, wherein T denotes time of one drive cycle, n denotes a number of the rows of the light-emitting devices, and m denotes a number of the columns of the light-emitting devices; and
wherein the second connector comprises n third pins and m fourth pins, each of the n third pins is electrically connected to a respective one first pin of the n first pins, each of the m fourth pins is electrically connected to a respective one second pin of the m second pins, and the drive unit is connected to the second connector and is configured to provide drive signals to the light-emitting devices through the second connector and the first connector.

9. The display device according to claim 8, wherein the first connector is a receptacle of a connector and the second connector is a plug of the connector paired with the receptacle of the connector.

10. The display device according to claim 9, wherein the backlight module further comprises a driver board on which the drive unit and the second connector are disposed, wherein the second connector is plugged into the first connector.

11. The display device according to claim 8, wherein the backlight board further comprises a substrate, first connection lines disposed on the substrate and second connection lines disposed on the substrate, wherein the light-emitting devices are disposed on one surface of the substrate, and the first connector is disposed on another surface of the substrate; each of the n first pins is electrically connected to the first electrodes of the light-emitting devices in the respective one row through a respective one first connection line of the first connection lines, and each of the m second pins is electrically connected to the second electrodes of the light-emitting devices in the respective one column through a respective one second connection line of the second connection lines.

12. The display device according to claim 11, wherein the backlight board further comprises a support structure, wherein the support structure and the light-emitting devices are located on a same surface of the substrate.

13. The display device according to claim 8, wherein in one drive cycle, the second drive signal comprises $2^n$ types of timing arrangement modes.

14. A backlight board, comprising:
light-emitting devices arranged in rows and columns and a first connector, wherein the first connector comprises n first pins and m second pins, each of the n first pins is electrically connected to first electrodes of light-emitting devices in a respective one row of the rows and is configured to provide a first drive signal for the light-emitting devices in the respective one row, and each of the m second pins is electrically connected to second electrodes of light-emitting devices in a respective one column of the columns and is configured to provide a second drive signal for the light-emitting devices in the respective one column; and in one drive cycle, the first drive signal drives light-emitting devices in each of the rows for a duration T/n at different times, and the second drive signal drives light-emitting devices in each of the columns for a duration T/n at different times, wherein T denotes time of one drive cycle, n denotes a number of the rows of the light-emitting devices, and m denotes a number of the columns of the light-emitting devices.

15. The backlight board according to claim 14, further comprising:
a substrate, first connection lines disposed on the substrate and second connection lines disposed on the substrate, wherein the light-emitting devices are disposed on one surface of the substrate, and the first connector is disposed on another surface of the substrate; each of the n first pins is electrically connected to the first electrodes of the light-emitting devices in the respective one row through a respective one first connection line of the first connection lines, and each of the m second pins is electrically connected to the second electrodes of the light-emitting devices in the respective one column through a respective one second connection line of the second connection lines.

16. The backlight board according to claim 15, further comprising:
a support structure, wherein the support structure and the light-emitting devices are located on a same surface of the substrate.

17. The backlight board according to claim 14, wherein in one drive cycle, the second drive signal comprises $2^n$ types of timing arrangement modes.

18. A driving method of a backlight board, applied to driving the backlight board according to claim 14, and comprises:
providing first drive signals for first pins while providing second drive signals for second pins; and
transmitting, by the first pins, the first drive signals to first electrodes of the light-emitting devices, and transmitting, by the second pins, the second drive signals to second electrodes of the light-emitting devices.

* * * * *